(12) United States Patent
Saldanha Singh et al.

(10) Patent No.: US 6,361,146 B1
(45) Date of Patent: Mar. 26, 2002

(54) ADHESIVE BONDING LAMINATES

(75) Inventors: Jeanne Marie Saldanha Singh, Lexington; Paul Timothy Spivey, Nicholasville, both of KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/334,169

(22) Filed: Jun. 15, 1999

(51) Int. Cl.$^7$ ............... B41J 2/14; B41J 2/045
(52) U.S. Cl. ............... 347/50; 347/49; 347/71
(58) Field of Search .................. 347/50, 49, 71, 347/86, 47; 428/343; 156/312

(56) References Cited

U.S. PATENT DOCUMENTS

| | | |
|---|---|---|
| 3,900,360 A | 8/1975 | Leatherman |
| 3,903,351 A | 9/1975 | Ando et al. |
| 4,199,645 A | 4/1980 | Schwarz |
| 4,273,827 A | 6/1981 | Sweeney et al. |
| 4,313,996 A | 2/1982 | Newman et al. |
| 4,497,678 A | 2/1985 | Nussbaum |
| 4,666,758 A | 5/1987 | Hunter et al. |
| 4,762,983 A | 8/1988 | Oogita et al. |
| 4,935,086 A | 6/1990 | Baker et al. |
| 5,204,399 A | 4/1993 | Edelman |
| 5,208,188 A | 5/1993 | Newman |
| 5,304,269 A | 4/1994 | Jacaruso et al. |
| 5,441,918 A | 8/1995 | Morisaki et al. |
| 5,592,737 A | 1/1997 | Middelman et al. |
| 5,643,390 A | 7/1997 | Don et al. |
| 5,696,032 A | 12/1997 | Phelps, Jr. et al. |
| 5,759,873 A | 6/1998 | Kata et al. |
| 5,766,740 A | 6/1998 | Olson |
| 5,863,815 A | 1/1999 | Egawa |

Primary Examiner—John Barlow
Assistant Examiner—Charles W. Stewart, Jr.
(74) Attorney, Agent, or Firm—John A. Brady

(57) ABSTRACT

An adhesive bonding laminate includes a first adhesive film that is capable of adhesively bonding to an epoxy coating and a second adhesive film that is capable of adhesively bonding to a stainless steel substrate. The first adhesive film is adhesively bonded to the second adhesive film. Ink jet printheads, ink jet print cartridges and methods of attaching a flexible circuit to a substrate employ the adhesive bonding laminate.

8 Claims, 4 Drawing Sheets

ADHESIVE BONDING LAMINATES

FIELD OF THE INVENTION

The present invention relates to adhesive bonding laminates, and more particularly, to adhesive bonding laminates which may be used to attach a flexible circuit to a substrate. The invention is also directed to methods of attaching a flexible circuit to a stainless steel substrate, and to ink jet printhead assemblies and ink jet print cartridges including such adhesive bonding laminates.

BACKGROUND OF THE INVENTION

Thermal ink jet print cartridges operate by rapidly heating a small volume of ink to generate a bubble caused by rapid vaporization of an ink vehicle for driving ink through one or more of a plurality of orifices so as to deposit one or more drops of ink on a recording medium, such as a sheet of paper. Typically, the orifices are arranged in one or more linear arrays in a nozzle member. The properly sequenced ejection of ink from each orifice causes characters or other images to be printed upon the paper as the printhead is moved relative to the paper. The paper is typically shifted each time the printhead moves across the paper. The thermal ink jet printer is generally fast and quiet, as only the ink droplet is in contact with the paper. Such printers produce high quality printing and can be made both compact and economical.

A typical ink jet cartridge assembly includes a cartridge body which is attached to a printhead assembly (sometimes referred to hereinafter as "printhead"). Ink which is disposed within the cartridge body flows to the printhead and is expelled in a known manner. More particularly, the cartridge body includes a die cavity in which the printhead is disposed. The printhead is in the form of a nozzle plate attached to a semiconductor chip. A plurality of heater elements are carried by the semiconductor chip, with each heater element being disposed adjacent to a respective nozzle in the nozzle plate. An electrical circuit, which may be in the form of a TAB (Tape Automated Bonding) circuit, electrically interconnects the heater elements with appropriate circuitry in the inkjet printer such that the cartridge elements may be selectively energized as the carriage of the printer travels across the print medium.

The printhead is typically disposed within the die cavity of the cartridge body on a substrate. The silicon chip and nozzle layer are attached to the substrate using a known die attach adhesive. The TAB circuit typically surrounds the printhead and is fastened to the circuit platform of the cartridge using a pressure sensitive adhesive. The TAB circuit includes a plurality of copper leads which extend therefrom and connect with the heater elements on the printhead.

The flexible circuit, TAB or wire bond, is typically comprised of a polyimide layer on which copper conductive traces are formed. Preferably, a thin layer of gold is formed on top of the copper conductive traces and provides an amount of protection from inks which can cause corrosion of the circuits. However, for circuits used at higher voltages and higher operating speeds, an epoxy coating or the like is often screened on top of these gold/copper traces to give further protection from inks. The circuit is typically adhered to the printhead and cartridge body by means of a pressure sensitive adhesive, for example an adhesive having an acrylic base.

During routine maintenance of the printhead in the printing process, the nozzle holes are wiped by a wiping mechanism. As a result, ink can travel to the underside of the circuit owing to capillary action of the acrylic-based pressure sensitive adhesive. The pressure sensitive adhesive allows the ink to wick under and be trapped between the circuit and the substrate, causing corrosion or electrical shorting of the flexible circuit in areas with no protective coating. Accordingly, there is a need for improved adhesives which exhibit a reduced ink wicking tendency.

When wire bonding, t he material use d to bond the circuit to the substrate must also provide the necessary support for the wire bond. The typical pressure sensitive adhesive is very soft and compliant and can yield under a load, and does not provide the stiffness under the flexible circuit that is essential for good wire bonding. Accordingly, an adhesive that has increased rigidity at a thickness of about 0.001 inch to about 0.003 inch is desired.

Furthermore, in many applications, precise alignment between the circuit and the print chip are necessary. In these cases, the circuit is in very close proximity or even in soft contact with the substrate during the alignment. The typical pressure sensitive adhesive does not allow the circuit to slip for fine alignment adjustments once it is in contact with the adhesive. One alternative to increase manufacturing efficiency is to provide a release liner on the pressure sensitive adhesive until after alignment and electrical inter connection of the flexible circuit and semiconductor chip. This however is not a reliable process, as removing the release layer potentially can stress the interconnect bonds between the flexible circuit and print chip where the release layer must be removed very close to any TAB bonds. Another alternative is to insert the adhesive between the circuit and substrate after electrically interconnecting the circuit and the print chip. However, the thin (about 0.001 inch) pressure sensitive adhesive bonding films are often too soft and compliant to be inserted between two surfaces in soft contact.

It would be advantageous to provide a film adhesive which provides good bonding, for example adhering to both a flexible circuit having an epoxy coating and a stainless steel substrate, while resisting ink wicking and allowing precise alignment of parts to be bonded. Therefore, there remains a need for an adhesive to attach a flexible circuit to a substrate, for example in an ink jet printhead assembly, which overcomes disadvantages of the prior art.

SUMMARY OF THE INVENTION

Accordingly, it is an object of the present invention to provide novel adhesive bonding laminates which overcome one or more disadvantages of the prior art. It is a more specific object of the invention to provide a dual layer adhesive bonding laminate which, when employed in an ink jet printhead assembly to bond a flexible circuit to a substrate, reduces or eliminates ink from wicking between the circuit and substrate and therefore prevents the ink from causing corrosion or electrical shorting of the flexible circuit.

These and additional objects and advantages are provided by an adhesive bonding laminate, ink jet printheads and ink jet print cartridges containing the same, and methods of attaching a flexible circuit to a substrate using the adhesive bonding laminate.

The adhesive bonding laminate of the present invention comprises a first adhesive film that is capable of adhesively bonding to an epoxy coating and a second adhesive film that is capable of adhesively bonding to a stainless steel substrate. Furthermore, the first adhesive film is adhesively bonded to the second adhesive film. In one embodiment of the invention, the first adhesive film comprises a polycarbonate adhesive film or a polyetherimide adhesive film, and the second adhesive film comprises a polyurethane adhesive film, a phenolic butyral adhesive film or a polyester adhesive film. Adhesive bond as used herein refers to a non-releasable, non-repositionable adhesive bond, unlike the releasable, repositionable adhesive bonds similar to those used as the adhesives in self-stick removable note pads, and the like.

The ink jet printhead of the present invention comprises a stainless steel substrate. A silicon chip is arranged on the stainless steel substrate. A flexible circuit or having an epoxy coating on one side thereof is attached to the stainless steel substrate using an adhesive bonding laminate of the present invention. The adhesive bonding laminate is located between the epoxy coated side of the flexible circuit and the stainless steel substrate.

The ink jet print cartridge of the present invention comprises an ink jet ink housing and an ink jet printhead, wherein the ink jet printhead comprises a stainless steel substrate attached to the ink jet print housing, a silicon chip located on the stainless steel substrate, a flexible circuit, and an adhesive bonding laminate of the present invention. The flexible circuit has an epoxy coating on one side thereof. The adhesive bonding laminate is located between the epoxy coated side of the flexible circuit and the stainless steel substrate.

The present invention also comprises a method for attaching a flexible circuit to a stainless steel substrate utilizing the adhesive bonding laminate of the present invention. A flexible circuit is aligned with a silicon chip attached to a stainless steel substrate. The alignment of the flexible circuit to the silicon chip preferably comprises aligning the wire bond pads of the flexible circuit with the bond pads of the silicon chip. Once aligned, the flexible circuit is then adhesively bonded to the stainless steel substrate using the adhesive bonding laminate. The rigidity of the adhesive bonding laminate enables the wire bond to be made. In one embodiment of the invention, the flexible circuit is electrically bonded to the silicon chip, and then the adhesive bonding laminate is inserted between the flexible circuit and the stainless steel substrate. Electrically bonding comprises making an electrical connection between the flexible circuit and the silicon chip. The flexible circuit is then adhesively bonded to the stainless steel substrate using the adhesive bonding laminate.

Still other objects, advantages and novel features of the present invention will become apparent to those skilled in the art from the following detailed description, which is simply by way of illustration various modes contemplated for carrying out the invention. As will be realized, the invention is capable of other different obvious aspects all without departing from the invention. Accordingly, the drawings and the description are illustrative in nature and not restrictive.

BRIEF DESCRIPTION OF THE DRAWING

While the specification concludes with claims particularly pointing out and distinctly claiming the present invention, it is believed the same will be better understood from the following description taken in conjunction with the accompanying drawings in which:

DETAILED DESCRIPTION

Reference will now be made in detail to various embodiments of the invention, an example of which is illustrated in the accompanying drawings, wherein the numerals indicate the same element throughout the views.

The invention will be described in a context of a tri-color ink jet cartridge but it will be evident from the following description that the principles of the invention are equally applicable to monochrome cartridges.

Figure 1:
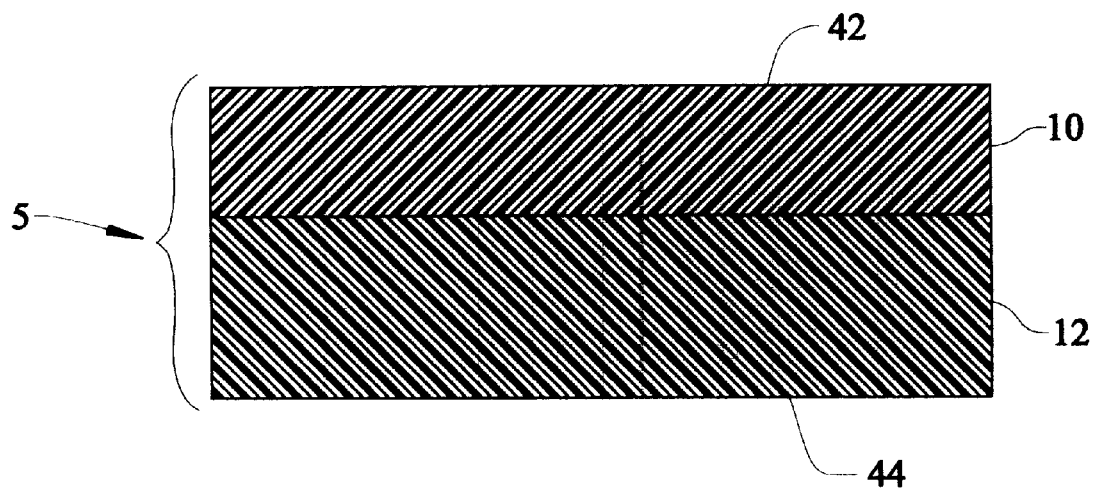
FIG. 1 is a cross-sectional view of one embodiment of an adhesive bonding laminate of the present invention.
Figure 2:
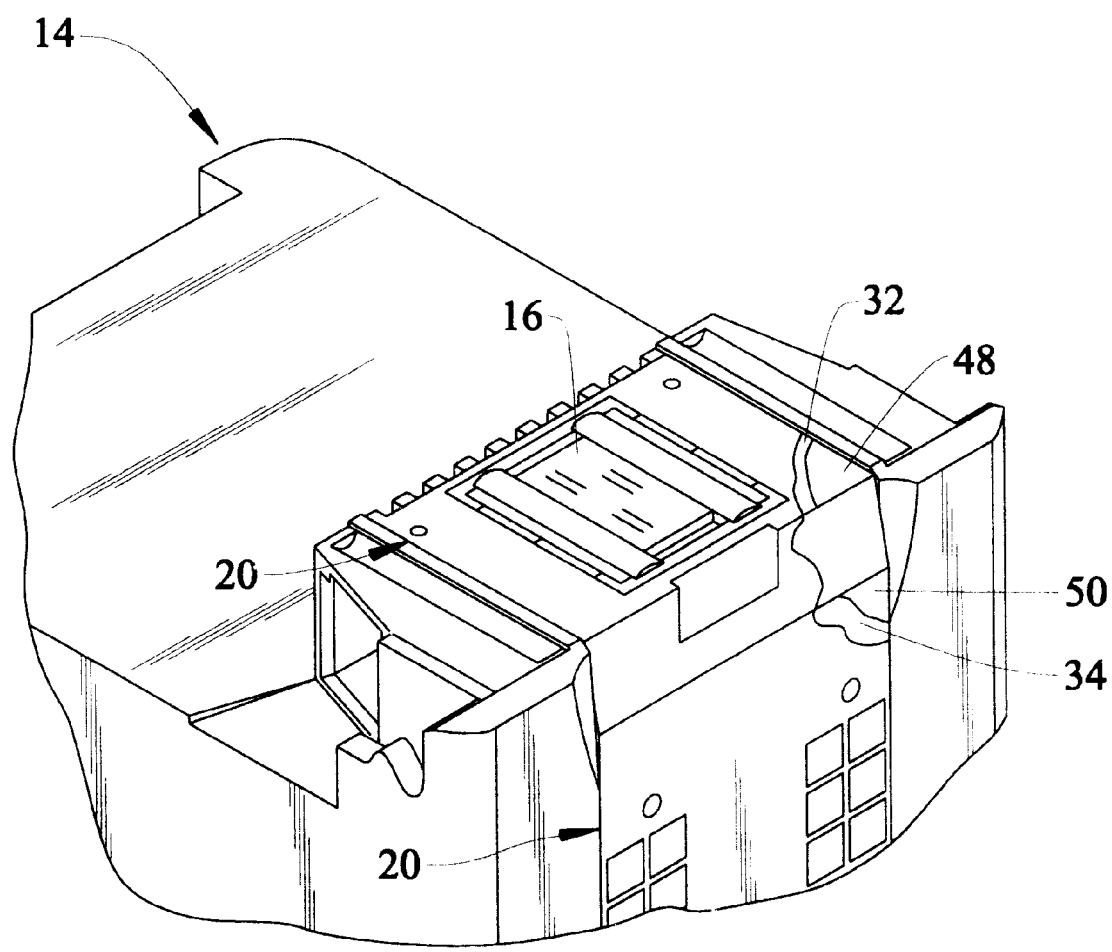
FIG. 2 is a perspective view of the bottom portion of an inkjet print cartridge and printhead.
Figure 3:
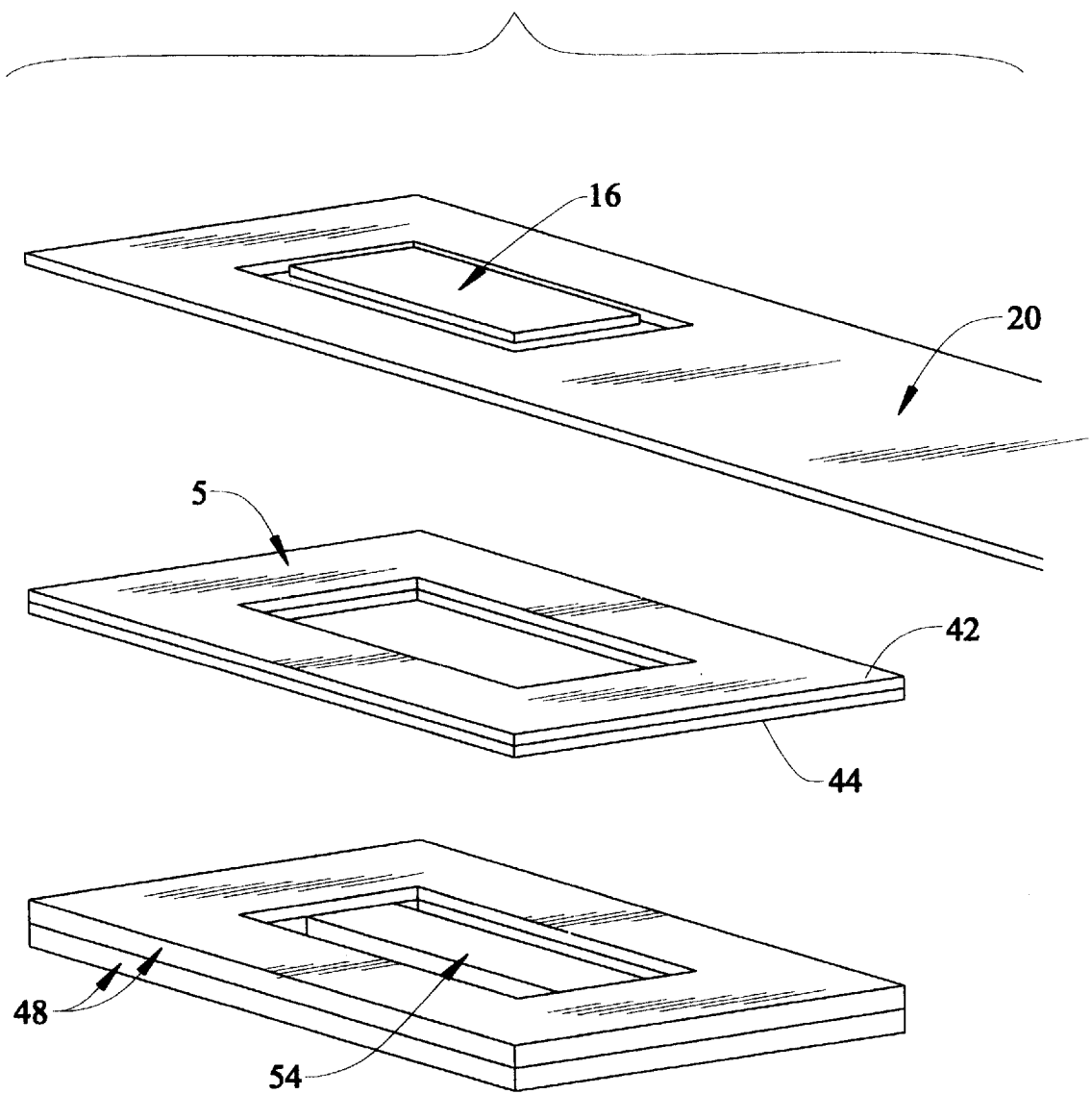
FIG. 3 is an exploded view of a printhead assembly.
Figure 5:
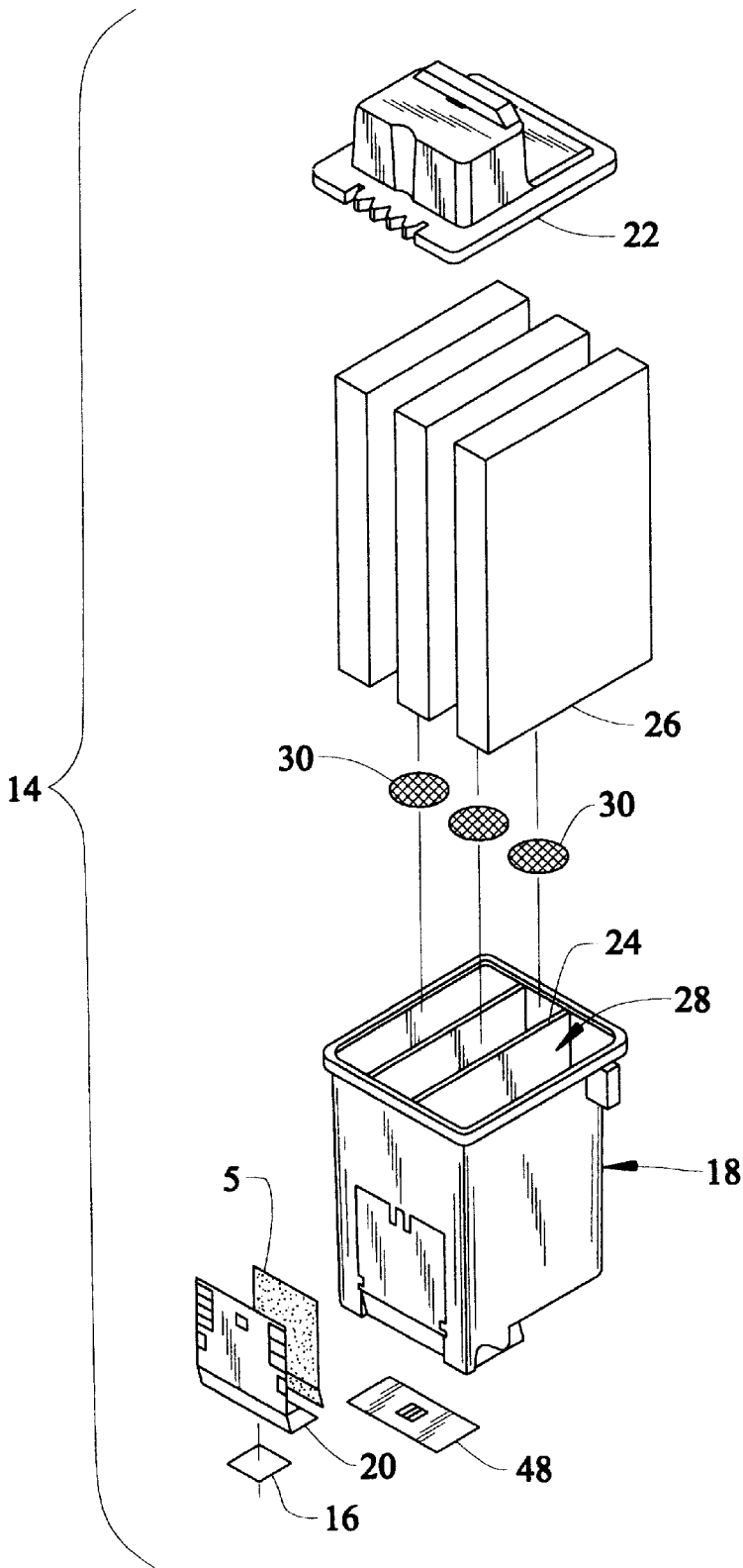
FIG. 5 is a perspective view of the bottom portion of an inkjet print cartridge.

As shown in FIG. 1, the present invention comprises a dual layer adhesive bonding laminate 5, comprising a first adhesive film 10, and a second adhesive film 12, wherein the first adhesive film 10 is adhesively bonded to the second adhesive film 12. Furthermore, the first adhesive film 10 is capable of adhesively bonding to an epoxy coated side of a flexible circuit, for example a flexible wire circuit 20 as shown in FIGS. 2, 3 and 5. The second adhesive film 12 is capable of adhesively bonding to a stainless steel substrate, for example substrate 48 as shown in FIGS. 2, 3 and 5. The phrase "adhesively bond" refers to a permanent, compatible adhesive bond.

In a preferred embodiment of the adhesive bonding laminate 5, the first adhesive film 10 comprises a polycarbon ate adhesive film or a polyetherimide adhesive film. The second adhesive film 12 comprises a polyurethane adhesive film, a phenolic butyral adhesive film or a polyester adhesive film. These films may be formed completely of the indicated polymers or contain the polymers in combination with other polymers and/or conventional adhesive components. Preferably, the adhesive bonding laminate 5 comprises a polycarbonate adhesive film for the first adhesive film 10 and a polyurethane adhesive film for the second adhesive film 12. In another embodiment of the present invention, the first adhesive film 10 comprises a polyetherimide adhesive film and the second adhesive film 12 comprises a phenolic butyral adhesive film or a polyester adhesive film. In yet another embodiment, the adhesive bonding laminate 5 comprises a polyetherimide adhesive film for the first adhesive film 10, and a phenolic butyral adhesive film for the second adhesive film 12. In another embodiment of the adhesive bonding laminate 5, the first adhesive 10 comprises a polyetherimide adhesive film and the second adhesive film 12 comprises a polyester adhesive film.

Adhesive films for use in the present invention are available from a variety of sources. For example, a polycarbonate adhesive film for use in the present invention may be obtained commercially from Alpha Metals under the designation Staystik 401. A polyurethane adhesive film for use in the adhesive bonding laminate may be obtained commercially, for example from J. P. Stevens Co. under the designation JPS 1880. A polyetherimide adhesive film for use in the present invention may be obtained commercially from GE Plastics under the designation Ultem 5000. A phenolic butyral adhesive film for use in the present invention may be obtained commercially, for example from Rogers Corporation under the designation 1000B200, and a polyester adhesive film for use in one embodiment of the present invention may be obtained commercially from 3M under the designation 667EG.

The thickness of the films for use in the laminates of the invention may vary depending on the desired use of the laminates. Suitably, each film may have a thickness ranging from about 0.001 to about 0.005 inch, with a film thickness of about 0.001 inch and a laminate thickness of about 0.002 inch being preferred for use in ink jet printhead assemblies as discussed herein.

In one embodiment of the present invention, the adhesive bonding laminate 5 comprises a first adhesive film 10 in direct contact with and bonded to the second adhesive film 12. In a more preferred embodiment of the adhesive bonding laminate 5, the first adhesive film 10 is in direct contact with and bonded to the second adhesive film 12 along the entirety of their adjacent surfaces, wherein the entire surface of the first adhesive film 10 is continuously adhesively bonded to the entire adjacent surface of the second adhesive film 12.

In another embodiment of the present invention, the adhesive bonding laminate 5 comprises a first adhesive film 10 in direct contact with and bonded to the second adhesive film 12. Interposed between the first adhesive film 10 and the second adhesive film 12 is a means for providing rigidity to the adhesive bonding laminate. The means may comprise an open fabric having high strength properties. The fabric may typically be formed of strands of glass fibers or the like.

In yet another embodiment of the present invention, the adhesive bonding laminate 5 comprises a first adhesive film 10 in direct contact with and bonded to the second adhesive film 12. The first adhesive film 10 and/or the second adhesive film 12 may comprise supported adhesive films. Supported adhesives comprise a means for providing rigidity to the adhesive film. The means may comprise a composite comprising an open fabric having high strength properties within the adhesive film. The adhesive is coated or formed typically on a glass fabric carrier. The fabric may typically be formed of strands of glass fibers or the like.

As shown in FIG. 2, one embodiment of the ink jet printhead of the present invention comprises a stainless steel substrate 48 mounted on a print cartridge 14, a silicon chip 16 mounted on the stainless steel substrate 48 and a TAB or flexible wire circuit 20 attached to the stainless steel substrate 48 and a print cartridge 14. The flexible wire or TAB circuit for use in the present invention may be obtained commercially from 3M. The epoxy coating on the TAB circuit for use in the present invention may be obtained commercially from Asahi Glass Co. under the designation CCR-232GF No. 6 Epoxy. The TAB circuit 20 is attached to the stainless steel substrate 48 by an adhesive bonding laminate 5 according to the invention. The adhesive bonding laminate 5 bonds the epoxy coated side of the flexible circuit 20 to the stainless steel substrate 48 and is not visible in FIG. 2.

Accordingly, FIG. 3 depicts an exploded view of the ink jet printhead assembly including the adhesive bonding laminate 5. The adhesive bonding laminate 5 is located between the stainless steel substrate 48 and the flexible circuit 20. The first side 42 of the adhesive bonding laminate 5 is adjacent the flexible circuit 20 and the second side 44 of the adhesive bonding laminate 5 is adjacent the stainless steel substrate 48. The adhesive bonding laminate 5 is suitably die cut or otherwise formed before assembly to allow the silicon chip 16 to be arranged adjacent to the stainless steel substrate 48 in a chip pocket 54.

Figure 4:
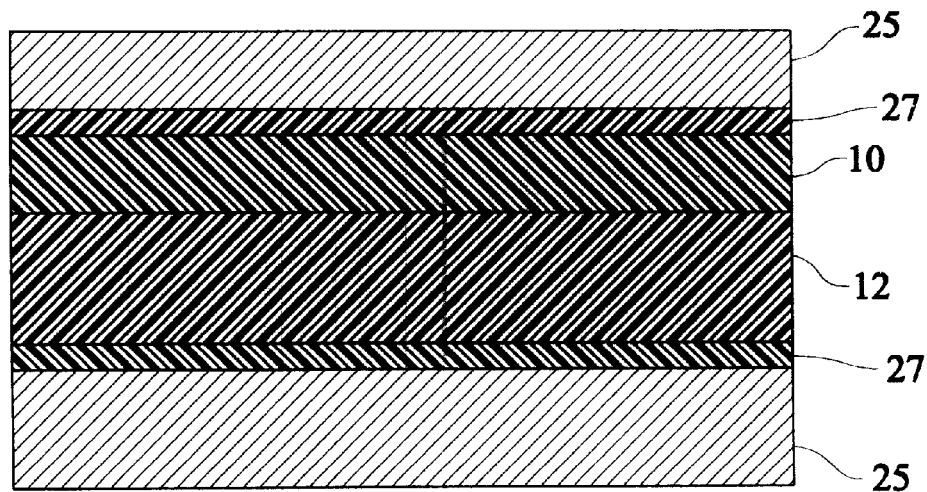
FIG. 4 is a cross-sectional view of the side portion of the adhesive laminate being formed in a heated press.

FIG. 4 depicts an exemplary manner for making the adhesive bonding laminate 5. The adhesive bonding laminate 5 may be prepared by placing the two films, i.e., the first adhesive film 10 and the second adhesive film 12, one on top of the other and between two release layers 27, formed of a release polytetrafluoroethylene (PTFE) such as Teflon® commercially available from Dupont. The assembled layers are then placed in a hot press 25 at a temperature and pressure, and for a time sufficient to achieve bonding of the adhesive layers 10 and 12 to one another. Suitable bonding conditions include, but are by no means limited to, a temperature of about 200° C. under about 30 psi for about one minute. The adhesive bonding laminate 5 may then be die cut to the appropriate shape and configuration, for example to allow the adhesive bonding laminate 5 to fit over the printhead chip 16.

Another embodiment of the present invention is directed to a method for attaching a flexible circuit 20 to a stainless steel substrate 48 for the purposes of wire bonding. First, the silicon chip 16 is provided on the stainless steel substrate 48. The second side 44 of the adhesive bonding laminate 5 is bonded to the stainless steel substrate 48, for example using a temperature of about 180° C. to about 200° C. under pressure. The flexible circuit 20 is then aligned with the silicon chip 16. The alignment of the flexible circuit preferably entails positioning the flexible circuit's wire bond pads in relation to the bond pads of the silicon chip for the purposes of making an electrical connection. As is conventional, the flexible circuit 20 has an epoxy coating on one side thereof. The first side 42 of the adhesive bonding laminate is then bonded to the epoxy coated side of the flexible circuit 20, for example using a temperature of about 180° C. to about 200° C. under pressure.

In another embodiment, the present invention comprises an alternate method for attaching a flexible circuit 20 already connected to a silicon chip 16 to a stainless steel substrate 48. The method comprises providing a silicon chip 16 bonded to a flexible circuit 20, and providing the adhesive bonding laminate 5 comprising a first side 42 having the first adhesive film 10, and a second side 44 having the second adhesive film 12. The chip/flexible circuit assembly is aligned with the stainless steel substrate 48. The chip is then adhesively bonded to the stainless steel substrate with an epoxy die attach resin. Then the adhesive bonding laminate 5 is inserted between the flexible circuit 20 and the substrate 48, wherein the first side 42 of the adhesive bonding laminate 5 is adjacent to the epoxy coated side of the flexible circuit 20 and the second side 44 of the adhesive bonding laminate 5 is adjacent to the substrate 48. The flexible circuit 20 is then bonded to the stainless steel substrate 48 by applying heat, for example at a temperature of about 180° C. to about 200° C., and pressure. In a preferred embodiment of this method, the first side 42 of the adhesive laminate 5 comprises a polycarbonate adhesive film and the second side 44 of the adhesive bonding laminate 5 comprises a polyurethane adhesive film.

As shown in FIG. 5, another embodiment of the present invention is directed to an ink jet print cartridge. The ink jet print cartridge shown is a tri-color inkjet printer cartridge. One skilled in the art will appreciate that the principles of the present invention are equally applicable to monochrome cartridges. The ink jet print cartridge 14 comprises an ink jet ink housing 18, a lid 22, and an ink jet printhead assembly which comprises a stainless steel substrate 48, a silicon chip 16 on the stainless steel substrate 48, and a flexible circuit 20 overlaid and attached to the stainless steel substrate 48 by an adhesive bonding laminate 5. The flexible circuit 20 is electrically connected to the silicon chip 16. In another embodiment, the ink jet print cartridge 14 further comprises three ink reservoir chambers 28 divided by two dividing walls 24, in a conventional manner. Three blocks of foam material 26 are inserted into chambers 28, wherein each block 26 is saturated with ink of a different color. The chambers 28 are provided with standpipes on their bottom surfaces through which ink may flow, the ink jet housing 18 having ink flow passages connecting the standpipes to three exit ports in the bottom surface of the housing. Three filters 30 cover the tops of the standpipes to filter the inks as they are drawn out of the chambers.

The foregoing description of the various embodiments of the invention has been presented for the purposes of illustration and description. It is not intended to be exhaustive or to limit the invention to the precise form disclosed. Many alternatives, modifications, and variations will be apparent to those skilled in the art of the above teaching. Accordingly, this invention is intended to embrace all alternatives, modifications, and variations that have been discussed herein, and others that fall within the spirit and broad scope of the claims.

We claim:

1. The adhesive bonding laminate comprising:
    a first adhesive file that is capable of adhesively bonding to an epoxy coating, said first adhesive film comprising a polycarbonate adhesive film or a polyetherimide adhesive film; and
    a second adhesive film that is capable of adhesively bonding to a stainless steel substrate, said second adhesive film comprising a polyurethane adhesive film, a phenolic butyral adhesive film or a polyester adhesive film,
    wherein the first adhesive film is adhesively bonded to the second adhesive film.

2. The adhesive bonding laminate of claim 1, wherein the first adhesive film comprises a polycarbonate adhesive film and the second adhesive film comprises a polyurethane adhesive film.

3. The adhesive bonding laminate of claim 1, wherein the first adhesive film comprises a polyetherimide adhesive film and the second adhesive film comprises a phenolic butyral adhesive film or a polyester adhesive film.

4. The adhesive bonding laminate of claim 3, wherein the second adhesive film comprises a phenolic butyral adhesive film.

5. The adhesive bonding laminate of claim 3, wherein the second adhesive film comprises a polyester adhesive film.

6. The adhesive bonding laminate of claim 1, wherein the first adhesive film is in direct contact with the second adhesive film along the entirety of their adjacent surfaces.

7. An ink jet printhead comprising:
    a stainless steel substrate;
    a silicon chip on the stainless steel substrate;
    a flexible circuit, wherein the flexible circuit has an epoxy coating on one side thereof; and
    the adhesive bonding laminate comprising:
        a first adhesive film that is capable of adhesively bonding to an epoxy coating; and
        a second adhesive film that is capable of adhesively bonding to a stainless steel substrate;
        wherein the first adhesive film is adhesively bonded to the second adhesive film; and
    wherein the adhesive bonding laminate is located between and is bonded to the flexible circuit and the stainless steel substrate.

8. An ink jet print cartridge, comprising:
    an ink jet ink housing;
    an ink jet printhead, wherein the ink jet printhead comprises:
        a stainless steel substrate attached to the ink jet ink housing;
        a silicon chip on the stainless steel substrate;
        a flexible circuit, wherein the flexible circuit has an epoxy coating on one side thereof; and
    the adhesive bonding laminate comprising:
        a first adhesive film that is capable of adhesively bonding to an epoxy coating; and
        a second adhesive film that is capable of adhesively bonding to a stainless steel substrate;
        wherein the first adhesive film is adhesively bonded to the second adhesive film; and
    wherein the adhesive bonding laminate is located between and is bonded to the flexible circuit and the stainless steel substrate.

* * * * *